(12) United States Patent
Holderer et al.

(10) Patent No.: US 6,842,294 B2
(45) Date of Patent: Jan. 11, 2005

(54) CATADIOPTRIC OBJECTIVE

(75) Inventors: Hubert Holderer, Koenigsbronn (DE);
Ulrich Weber, Ulm (DE); Alexander Kohl, Aalen (DE); Toralf Gruner, Koenigsbronn (DE); Christoph Zaczek, Heubach (DE); Jens Ullmann, Oberkochen (DE); Martin Weiser, Sinsheim (DE); Bernhard Gellrich, Aalen (DE); Hartmut Muenker, Hilchenbach-Dahlbruch (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/118,479

(22) Filed: Apr. 8, 2002

(65) Prior Publication Data
US 2002/0181125 A1 Dec. 5, 2002

(30) Foreign Application Priority Data
Apr. 11, 2001 (DE) .......................................... 101 18 047

(51) Int. Cl.[7] .............................. G02B 3/00; G02B 17/00
(52) U.S. Cl. ....................................... 359/649; 359/726
(58) Field of Search .................................. 359/726, 730, 359/732, 656–661, 649–651, 833–836

(56) References Cited

U.S. PATENT DOCUMENTS

| 3,655,264 A | * | 4/1972 | Pickett ........................ 359/482 |
| 5,559,629 A | * | 9/1996 | Sheets et al. ................ 359/364 |
| 5,581,413 A | * | 12/1996 | Anderson .................... 359/730 |
| 5,805,356 A | * | 9/1998 | Chiba .......................... 359/727 |
| 5,959,784 A | * | 9/1999 | Seki et al. ................... 359/663 |
| 6,195,213 B1 | | 2/2001 | Omura et al. ............... 359/727 |
| 2003/0011755 A1 | * | 1/2003 | Omura et al. ................. 355/67 |

FOREIGN PATENT DOCUMENTS

| JP | 10-96981 | * 4/1998 |
| WO | WO 95/309818 | 11/1995 |

* cited by examiner

*Primary Examiner*—Jordan M. Schwartz
(74) *Attorney, Agent, or Firm*—Welsh & Katz, Ltd.

(57) ABSTRACT

A catadioptric objective comprises a plurality of lenses and at least two deflecting mirrors that have reflecting surfaces that are at a specific angle, in particular of 90°, to one another. The two deflecting mirrors are arranged with their reflecting surfaces on a common base member whose position in the objective can be set.

2 Claims, 3 Drawing Sheets

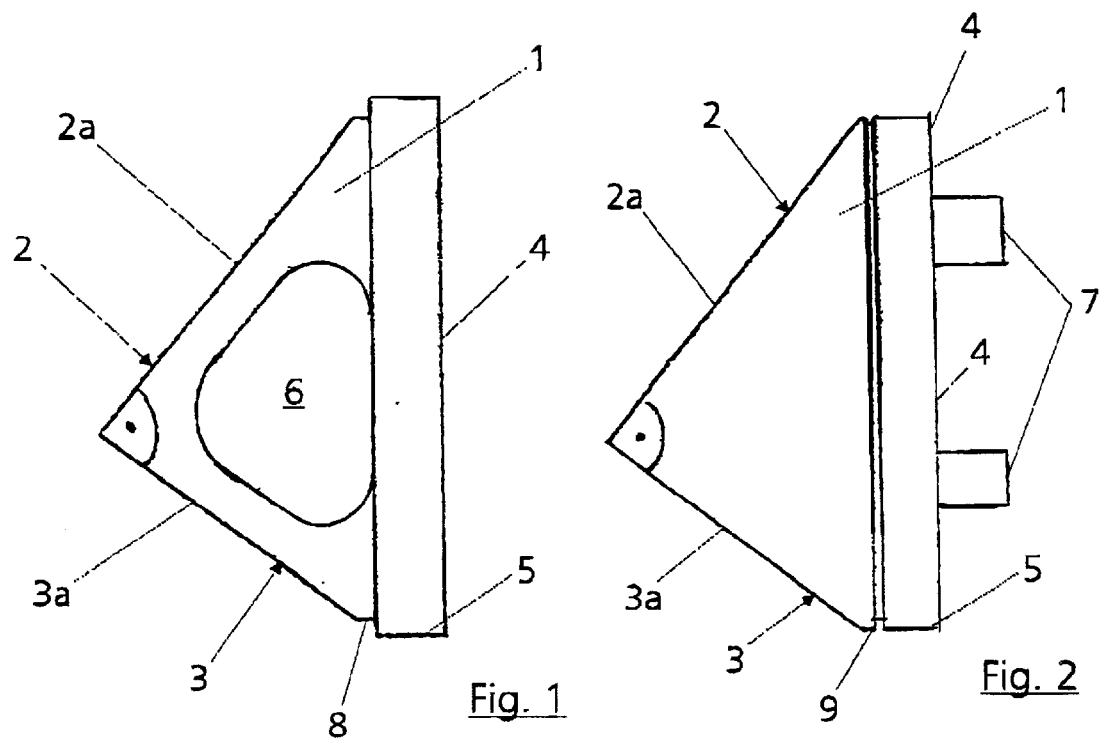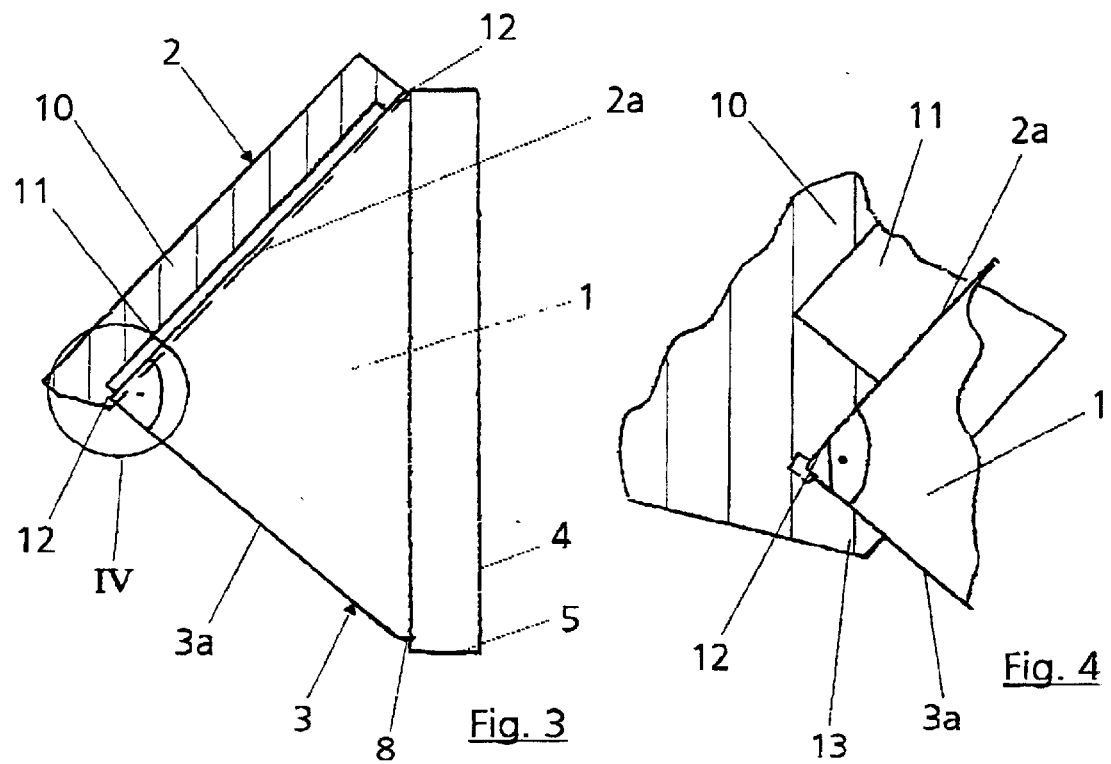

CATADIOPTRIC OBJECTIVE

BACKGROUND OF THE INVENTION

1. Field of the Invention

The invention relates to a catadioptric objective, specifically it relates to a projection exposure objective for semiconductor microlithography, comprising a plurality of lenses and comprising at least two deflecting mirrors that have reflecting surfaces that are at a specific angle, in particular of 90°, to one another.

2. Description of the Related Art

In the case of catadioptric objectives for microlithography, for example in the case of wavelengths of 157 nm, two deflecting mirrors are used that must be at a very precisely defined angle of 90° to one another. This angular position must also be retained exactly. Moreover, the natural frequency of the mirrors must be very high so that no aberrations occur. For this reason, they may also not vibrate relative to one another.

WO 95/30918 discloses binoculars, mirrors being held against reference surfaces and being adjusted in a specific angular position relative to one another. (FIGS. 16 to 20).

SUMMARY OF THE INVENTION

It is the object of the present invention to create a catadioptric objective, the deflecting mirrors being adjusted and held exactly relative to one another, and the aim being to provide a high stiffness simultaneously.

This objective is achieved according to the invention by means of a catadioptric objective, wherein the two deflecting mirrors are arranged with their reflecting surfaces on a common base member whose position in the objective can be set.

A very stiff configuration can be achieved by means of the combination according to the invention of the two deflecting mirrors on a common base member. Moreover, the mirrors cannot vibrate in phase opposition. Again, a configuration that saves a great deal of space is achieved by the common arrangement on the base member.

A further very substantial advantage consists in that during adjustment of the two deflecting mirrors, during settings or adjustments, their position relative to one another is basically maintained exactly, and thus a prescribed angle is always observed between the two reflecting surfaces.

Owing to the fact that the adjustment of the two deflecting mirrors in the objective is performed jointly via the base member, the manipulation or installation is facilitated in practice. This is the case, in particular, whenever for this purpose the base member is provided with a reference surface for the adjustment.

Additional advantages of the present invention will become apparent to those skilled in the art from the following detailed description of exemplary embodiments of the present invention.

BRIEF DESCRIPTION OF THE DRAWINGS

FIG. 1 shows a first configuration of two deflecting mirrors with a common base member, FIG. 2 shows a configuration of two deflecting mirrors with a common base member and a circumferential bearing groove, FIG. 3 shows the embodiment according to FIG. 1 with a cover plate for coating the reflecting surfaces, FIG. 4 shows a detailed enlargement in accordance with IV according to FIG. 3.

DETAILED DESCRIPTION

Figure 5:
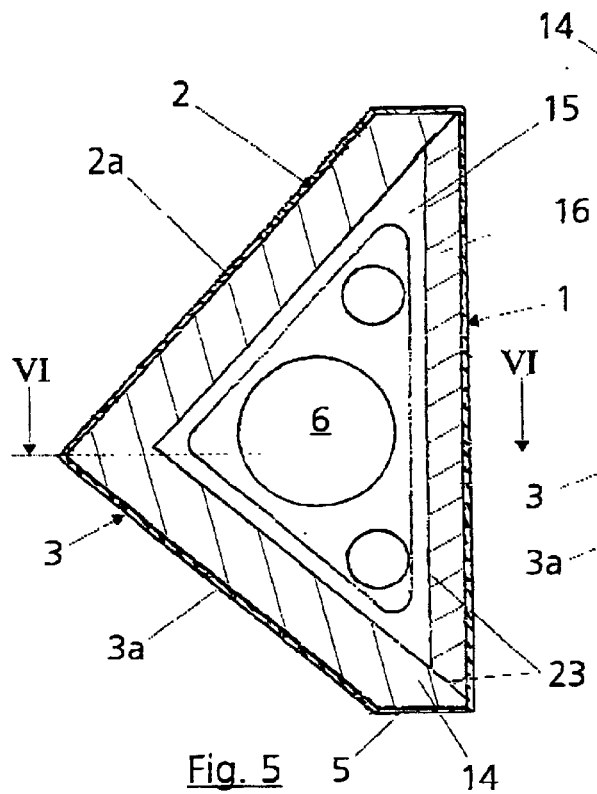
FIG. 5 shows a second embodiment of two deflecting mirrors with a common base member.

FIG. 1 shows a first embodiment, two deflecting mirrors 2 and 3 with reflecting surfaces 2a and 3a being arranged on a base member 1. The base member has the form of a prism with a right angle at which the two deflecting mirrors 2 and 3 abut one another. The reflecting surfaces 2a and 3a are formed by an appropriate coating. A material of low thermal expansion and which can be highly polished is preferably used for this purpose as substrate. The base member 1 has a rear surface 4 for mounting a manipulator 26 for the purpose of initiating an adjusting movement or for connection with a mount of a catadioptric objective illustrated in FIG. 10. Furthermore, a reference surface 5 is provided on the base member for the adjustment of the base member 1, and thus of the two deflecting mirrors 2 and 3 on the base member 1.

In order to reduce the mass, the base member 1 is provided with a milled-out portion 6 (illustrated only by way of example).

FIG. 2 shows an essentially identical configuration, a different geometry with attachments 7 on the rear surface 4 being provided on the rear surface.

In order to induce as few and uniform stresses as possible during vacuum deposition of the reflecting surfaces 2a and 3a or of the reflecting layer, it is favorable to apply the two reflecting surfaces 2a and 3a in one operation. It is possible for this purpose to provide a circumferential shoulder 8 in accordance with FIG. 1, or else a circumferential bearing groove 9 in accordance with FIG. 2.

If different layers are to be applied to the two reflecting surfaces 2a and 3a, the surface respectively not to be coated must be protected. This can be performed by means of a cover plate 10, as illustrated in FIG. 3 and in an enlarged detail in FIG. 4. The cover plate 10 should be provided in this case, on its side facing the reflecting surface 2a or 3a to be covered, with a set-back surface 11, in order to protect the scratch-sensitive surface, in particular the extremely sensitive optical surface, on the reflecting surface 2a or 3a. The cover plate 10 therefore bears on the reflecting surface 2a or 3a only in a region not used optically, as represented by "12".

It is advantageous in this case if the cover provided by the cover plate 10 goes beyond the edge at which the two reflecting surfaces 2a and 3a abut one another, since this prevents inadequate deposition of the cover. This is visible from the enlarged illustration in FIG. 4, the cover plate 10 being provided for this purpose with an extension 13 embracing the common edge.

Figure 6:
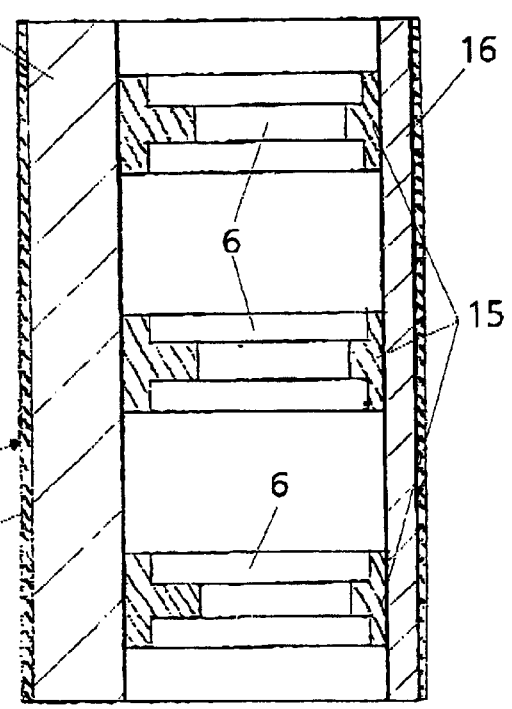
FIG. 6 shows a section along the lines VI—VI according to FIG. 5.

FIGS. 5 and 6 show an exemplary embodiment, the entire unit being assembled from a plurality of parts. In this case, the two reflecting surfaces 2a and 3a of the deflecting mirrors 2 and 3 are supported by an angle 14 and are stiffened by a plurality of stiffening ribs 15 and a back plate 16. The individual components can be connected by soldering, sintering or else in any other way. A base member 1 in the form of a frame is created with the aid of this configuration. The stiffening ribs 15, which can be provided with cutouts or bores 6 of different size in order to yield corresponding weight reductions extend, arranged at a spacing from one another, between the angle 14 and the back plate 16. The optically polishable layer can be applied after grinding of the optically used surfaces.

Figure 7:
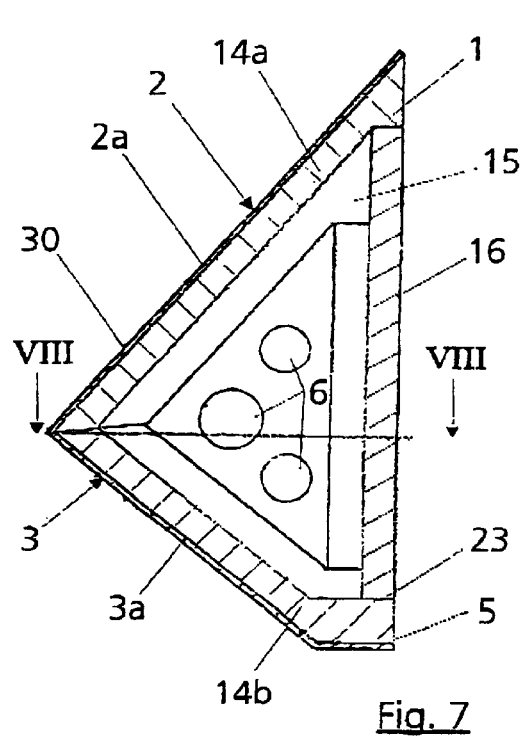
FIG. 7 shows an embodiment with soldered deflecting mirrors.
Figure 8:
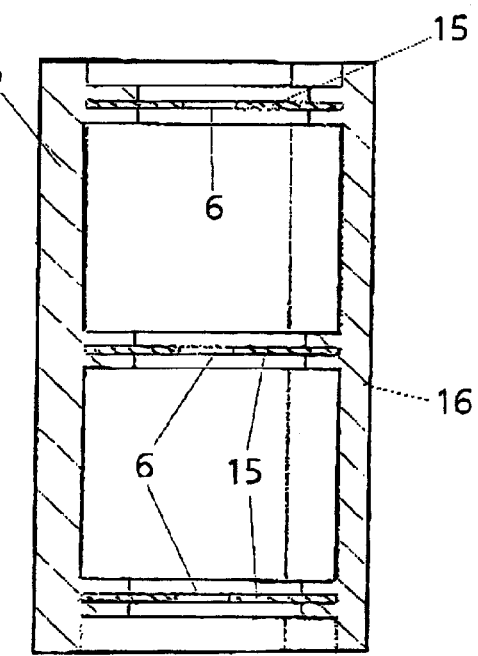
FIG. 8 shows an embodiment in which the two deflecting mirrors are connected to the base member via adjustable holders.

FIGS. 7 and 8 show a largely similar configuration to that in FIGS. 5 and 6. What is different is that the angle 14 is formed in this case from two individual mirror plates 14a and 14b. The two mirror plates 14a and 14b are soldered to one another at their common edge, or connected to one another in a different way. A connection to the back plate 16 can be performed in a similar way at their rear ends. Stiffening ribs 15 that are provided with a multiplicity of bores 6 for reducing weight are provided, in turn for stiffening purposes.

Figure 9:
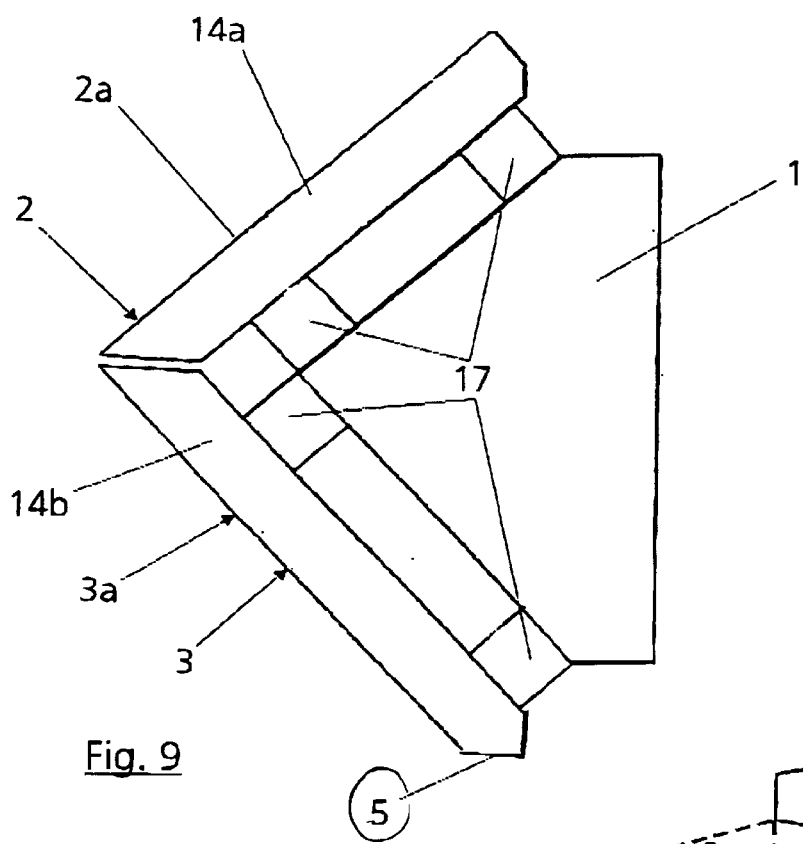
FIG. 9 shows the principle of a design of a catadioptric objective with the deflecting mirrors according to the invention.

FIG. 9 shows an embodiment similar to the embodiment according to FIGS. 7 and 8. The reflecting layers 2a and 3a are applied to the mirror plates 14a and 14b. The two mirror plates 14a and 14b are mounted on the base member 1 by means of adjustable holders 17. The angular position of the two mirror plates 14a and 14b can be set relative to one another by means of the adjustable holders.

Figure 10:
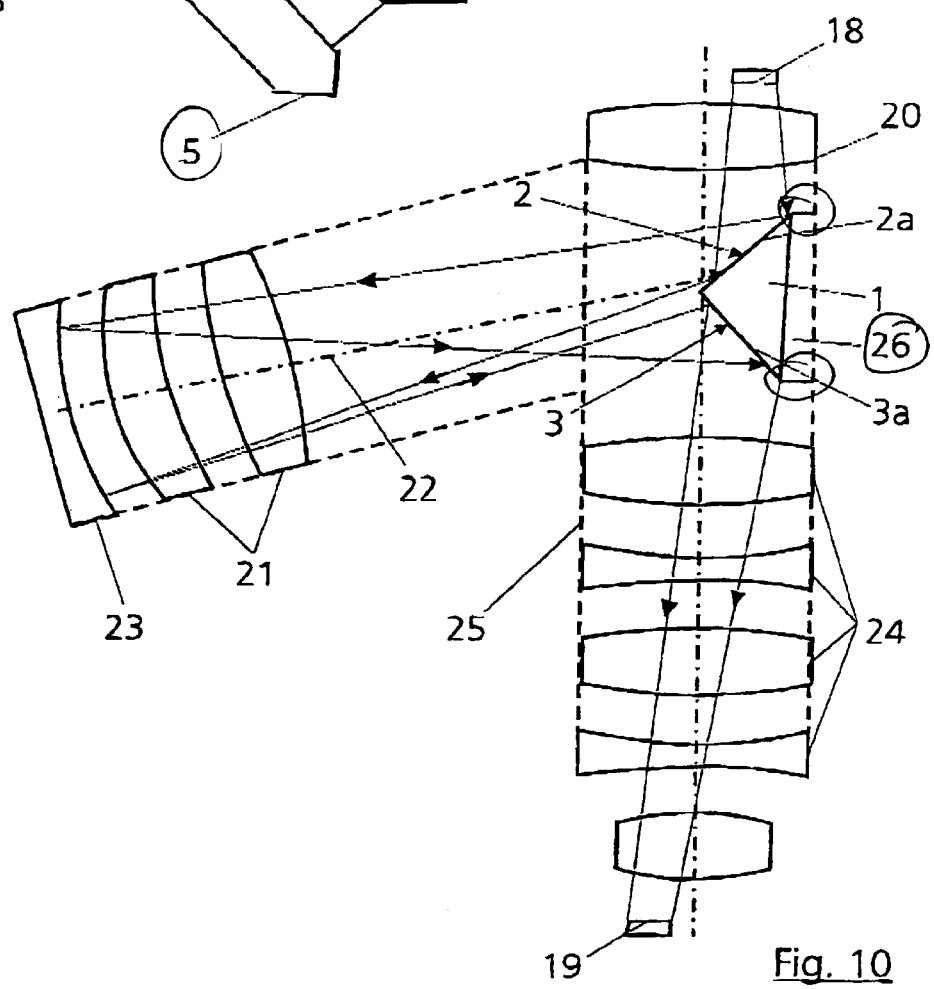
FIG. 10 shows an illustration of the principle of the catadioptric objective of the subject invention.

FIG. 10 shows an illustration of the principle of a catadioptric objective 25 (indicated only by dashes) with a beam path illustrated only in principle. An illuminated region 18, for example a reticle, is imaged on a wafer 19. In this process, the light is reflected downstream of a first lens group 20 (only one being illustrated for simplification) with a vertical optical axis on the top reflecting surface 2a of the two deflecting mirrors 2 and 3 into a lens group 21 with a virtually horizontal axis 22, and turned back from there at an arcuate mirror 23. The light is then sent at the lower reflecting surface 3a into a lower lens group 24 with, once again, a vertical optical axis. The base member 1, on which the two deflecting mirrors 2 and 3 are arranged, is connected (in a way not shown in more detail) to the mount of the objective 25, it also being possible to provide corresponding adjusting elements and manipulator 26.

What is claimed is:

1. A device for semiconductor microlithography comprising a projection exposure objective that includes a plurality of lenses and at least two deflecting mirrors that have reflecting surfaces that are fixed at a specific angle to one another, wherein the two deflecting mirror are arranged with their reflecting surfaces on a common base member and wherein the base member is a reduced mass construction with measures selected from the group consisting of bores, cutouts, milled-out portions, an approximate frame structure and stiffening ribs.

2. The objective as claimed in claim 1, wherein the base member is mounted to a manipulator to initiate an adjusting movement.

* * * * *

UNITED STATES PATENT AND TRADEMARK OFFICE
CERTIFICATE OF CORRECTION

PATENT NO. : 6,842,294 B2
DATED : January 11, 2005
INVENTOR(S) : Hubert Holderer et al.

It is certified that error appears in the above-identified patent and that said Letters Patent is hereby corrected as shown below:

<u>Column 4,</u>
Line 21, delete "two deflecting mirror are arranged" and replace with -- two deflecting mirrors are arranged --.

Signed and Sealed this

Twenty-seventh Day of September, 2005

JON W. DUDAS
*Director of the United States Patent and Trademark Office*